US009680052B2

(12) United States Patent
Löffler et al.

(10) Patent No.: US 9,680,052 B2
(45) Date of Patent: Jun. 13, 2017

(54) OPTOELECTRONIC GAN-BASED COMPONENT HAVING INCREASED ESD RESISTANCE VIA A SUPERLATTICE AND METHOD FOR THE PRODUCTION THEREOF

(71) Applicant: OSRAM Opto Semiconductors GmbH, Regensburg (DE)

(72) Inventors: Andreas Löffler, Neutraubling (DE); Tobias Meyer, Ihrlerstein (DE); Adam Bauer, Donaustauf (DE); Christian Leirer, Friedberg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/785,461

(22) PCT Filed: Apr. 23, 2014

(86) PCT No.: PCT/EP2014/058240
§ 371 (c)(1),
(2) Date: Oct. 19, 2015

(87) PCT Pub. No.: WO2014/173950
PCT Pub. Date: Oct. 30, 2014

(65) Prior Publication Data
US 2016/0079470 A1    Mar. 17, 2016

(30) Foreign Application Priority Data
Apr. 26, 2013   (DE) .................. 10 2013 104 272

(51) Int. Cl.
*H01L 33/00*    (2010.01)
*H01L 33/06*    (2010.01)
(Continued)

(52) U.S. Cl.
CPC ........ *H01L 33/06* (2013.01); *H01L 21/02499* (2013.01); *H01L 21/02505* (2013.01);
(Continued)

(58) Field of Classification Search
CPC ......... H01L 21/02505; H01L 21/02499; H01L 33/06; H01L 21/02507; H01L 33/04
See application file for complete search history.

(56) References Cited

U.S. PATENT DOCUMENTS

2008/0025360 A1    1/2008  Eichler
2012/0146048 A1*   6/2012  Kato .................... H01L 33/325
                                                                257/76
(Continued)

FOREIGN PATENT DOCUMENTS

DE    10 2004 025 610 A1    11/2005
DE    10 2006 059 995 A1    11/2007
(Continued)

OTHER PUBLICATIONS

First Office Action dated Jan. 19, 2017, from corresponding Chinese Application No. 201480023548.6 in English.

*Primary Examiner* — Ngan Ngo
(74) *Attorney, Agent, or Firm* — DLA Piper LLP (US)

(57) ABSTRACT

An optoelectronic component includes a semiconductor layer structure having a quantum film structure, and a p-doped layer arranged above the quantum film structure, wherein the p-doped layer includes at least one first partial layer and a second partial layer, and the second partial layer has a higher degree of doping than the first partial layer.

16 Claims, 3 Drawing Sheets

(51) Int. Cl.
  *H01L 21/02*    (2006.01)
  *H01L 33/04*    (2010.01)
  *H01L 33/14*    (2010.01)
  *H01L 33/32*    (2010.01)

(52) U.S. Cl.
  CPC .... *H01L 21/02507* (2013.01); *H01L 33/0075* (2013.01); *H01L 33/04* (2013.01); *H01L 33/14* (2013.01); *H01L 33/325* (2013.01)

(56) References Cited

U.S. PATENT DOCUMENTS

| | | |
|---|---|---|
| 2012/0223347 A1 | 9/2012 | Yoon et al. |
| 2012/0313109 A1 | 12/2012 | Lee |
| 2013/0020608 A1 | 1/2013 | Makino et al. |
| 2015/0001560 A1* | 1/2015 | Ryden ................. H01L 27/153 257/88 |

FOREIGN PATENT DOCUMENTS

| | | |
|---|---|---|
| DE | 10 2009 060 747 A1 | 7/2011 |
| DE | 10 2009 060 750 A1 | 7/2011 |
| DE | 10 2011 100 037 A1 | 10/2012 |
| EP | 1 403 932 A1 | 3/2004 |
| EP | 1 883 140 A1 | 1/2008 |
| WO | 2009/045005 A2 | 4/2009 |

\* cited by examiner

OPTOELECTRONIC GAN-BASED COMPONENT HAVING INCREASED ESD RESISTANCE VIA A SUPERLATTICE AND METHOD FOR THE PRODUCTION THEREOF

TECHNICAL FIELD

This disclosure relates to an optoelectronic component and a method of producing an optoelectronic component.

BACKGROUND

US 2013/0020608 A1 discloses an optoelectronic component.

It is known that nitride semiconductor chips, for example, optoelectronic nitride semiconductor chips, can be permanently damaged or destroyed by very small electrostatic discharges (ESD). If a sapphire-comprising substrate is used during production of such semiconductor chips, a crystal having a high dislocation density arises during the epitaxial growth of a nitride semiconductor layer sequence. The dislocations act as leakage current paths via which leakage currents can flow in an ESD loading, which can lead to the nitride semiconductor chip being damaged or destroyed.

To avoid damage resulting from electrostatic discharges, protective measures are required. It is known to connect nitride semiconductor chips to separate protective diodes and arrange them in a common housing. In an ESD loading, the charge pulse can flow away via the protective diode without the nitride semiconductor chip being damaged. However, the required size of the common housing increases as a result of the separate protective diode.

SUMMARY

We provide an optoelectronic component including a semiconductor layer structure having a quantum film structure, and a p-doped layer arranged above the quantum film structure, wherein the p-doped layer includes at least one first partial layer and a second partial layer, and the second partial layer has a higher degree of doping than the first partial layer.

We also provide a method of producing an optoelectronic component including providing a substrate, growing a quantum film structure, and growing a p-doped layer, wherein growing the p-doped layer includes growing at least one first partial layer and a second partial layer, and the second partial layer has a higher degree of doping than the first partial layer.

We further provide an optoelectronic component including a semiconductor layer structure having a quantum film structure, and a p-doped layer arranged above the quantum film structure, wherein the p-doped layer includes at least one first partial layer and a second partial layer, the second partial layer has a higher degree of doping than the first partial layer, the p-doped layer includes a plurality of first partial layers and second partial layers which alternately succeed one another, the p-doped layer has an indium proportion of less than 30%, and the p-doped layer has an aluminum proportion of less than 30%.

LIST OF REFERENCES

Figure 1:
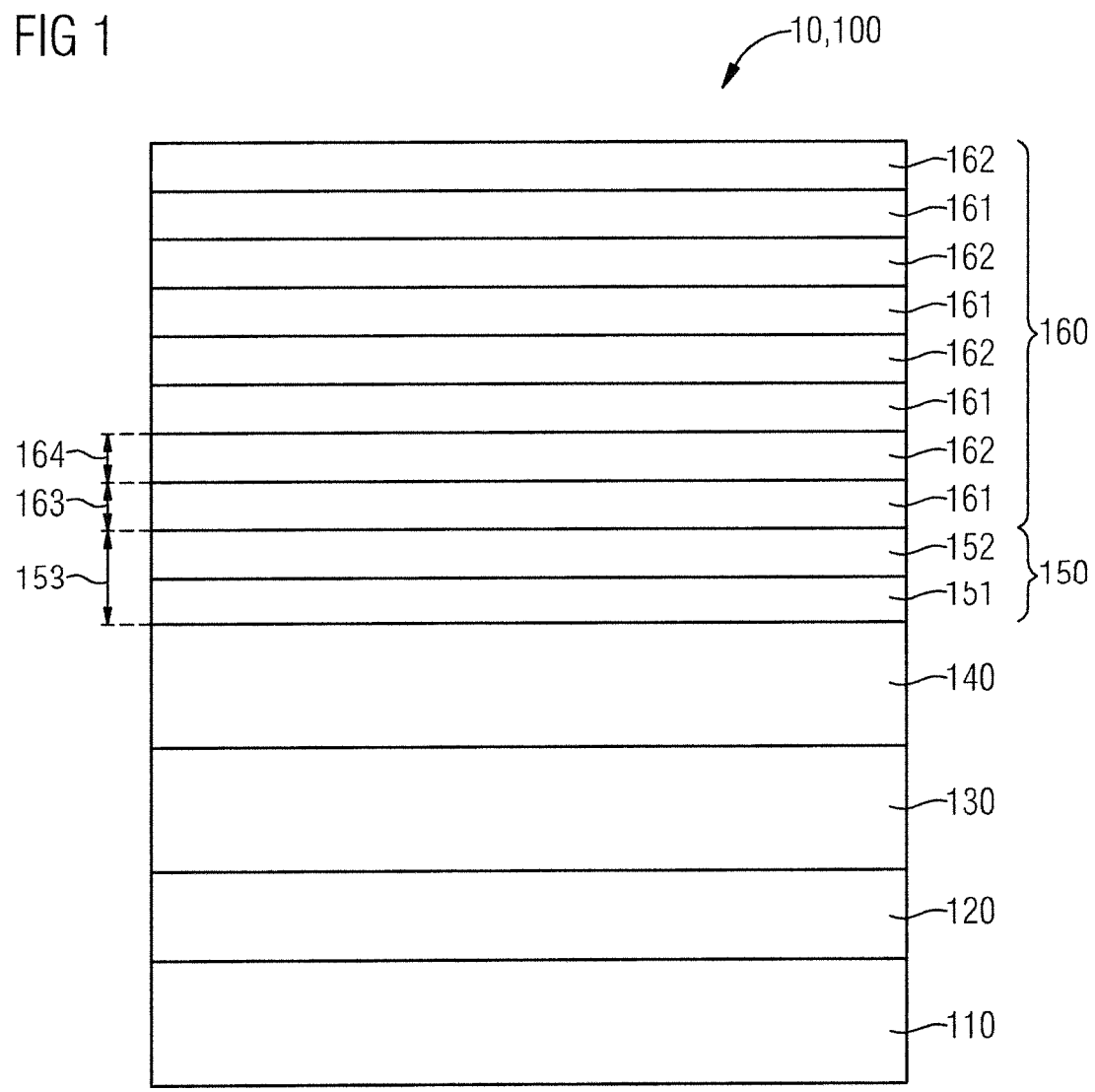
FIG. 1 shows a schematic sectional illustration of a semiconductor layer structure of an optoelectronic component.

10 Optoelectronic component
100 Semiconductor layer structure
110 Substrate
120 Buffer layer
130 n-doped layer
140 Quantum film structure
150 Spacer layer
151 First partial spacer layer
152 Second partial spacer layer
153 First layer thickness (d1)
160 P-doped layer
161 First partial layer
162 Second partial layer
163 Second layer thickness (d2)
164 Third layer thickness (d3)
200 First growth diagram
210 Time
211 First point in time
212 Second point in time
213 Third point in time
214 Fourth point in time
215 Fifth point in time
216 Sixth point in time
220 Band gap energy
221 First band gap energy (InGan)
222 Second band gap energy (GaN)
300 Second growth diagram
311 First partial period of time
312 Second partial period of time
320 Degree of p-doping
321 First degree of doping (x1=0)
322 Second degree of doping (x2)
323 Third degree of doping (x3)

DETAILED DESCRIPTION

We provide an optoelectronic component comprising a semiconductor layer structure having a quantum film structure and a p-doped layer arranged above the quantum film structure. In this case, the p-doped layer comprises at least one first partial layer and a second partial layer. The second partial layer has a higher degree of doping than the first partial layer. Advantageously, the more highly doped second partial layer has a higher electrical conductivity. In an ESD loading of the optoelectronic component, a leakage current flowing through the semiconductor layer structure is thereby spread and distributed in a lateral direction in the second partial layer of the p-doped layer.

This counteracts a narrow spatial delimitation of the leakage current and prevents excessively high local current densities. Advantageously, the risk of damage to the optoelectronic component in an ESD loading can thereby be reduced. This advantageously results in an integrated ESD protection of the optoelectronic component which manages without measures accompanied by an impaired crystal quality of the semiconductor layer structure of the optoelectronic component. The integrated ESD protection of the optoelectronic component advantageously also makes it possible to dispense with providing an external protective diode as result of which the optoelectronic can be produced more cost-effectively and have smaller dimensions.

The first partial layer may have a degree of doping less than $5\times10^{18}$ per cubic centimeter and is preferably zero. Advantageously, the first partial layer then has a greatly reduced conductivity.

The second partial layer may have a degree of doping $1\times10^{18}$ per cubic centimeter to $1.5\times10^{20}$ per cubic centimeter, preferably $2\times10^{19}$ per cubic centimeter to $8\times10^{19}$ per cubic centimeter. By way of example, the second partial layer can have a degree of doping that is $4\times10^{19}$ per cubic centimeter. Advantageously, the second partial layer then has a significantly higher conductivity than the first partial layer. As a result, leakage currents flowing parallel to the growth direction through the semiconductor layer structure of the optoelectronic component can be spread in a lateral direction in the second partial layer.

The first partial layer and the second partial layer each may have a thickness of 1 nm to 50 nm, preferably a thickness of 5 nm to 20 nm, particularly preferably a thickness of 8 nm to 12 nm. By way of example, the first partial layer and the second partial layer can each have a thickness of 10 nm. Partial layers having this thickness have advantageously proved to be particularly expedient in experiments.

The p-doped layer comprises a plurality of first partial layers and second partial layers which alternately succeed one another. Advantageously, the plurality of second partial layers each bring about a current distribution of a leakage current flowing in the growth direction through the semiconductor layer structure of the optoelectronic component in the case of an ESD loading as a result of which the risk of damage to the optoelectronic component as a result of such a leakage current is reduced.

The p-doped layer may comprise 1 to 50 first partial layers, preferably three first partial layers. Advantageously, experiments have shown that a number of three first partial layers of the p-doped layer can bring about a particularly expedient effect.

Two second partial layers may have different degrees of doping. Advantageously, the doping of the p-doped layer can thereby be both modulated and subjected to an additional variation. It is also possible for two first partial layers to have different degrees of doping.

A spacer layer may be arranged between the quantum film structure and the p-doped layer. Advantageously, this prevents the quantum film structure from being disadvantageously influenced by the doping of the p-doped layer.

The spacer layer may have a thickness of 2 nm to 120 nm. Preferably, the spacer layer has a thickness of 10 nm to 50 nm. Particularly preferably, the spacer layer has a thickness of 20 nm to 30 nm. By way of example, the spacer layer can have a thickness of approximately 25 nm. A spacer layer having this thickness advantageously prevents the quantum film structure from being adversely influenced by the doping of the p-doped layer, without the quantum film structure and the p-doped layer being spaced apart from one another by an excessively great distance.

The spacer layer may comprise a first partial spacer layer having a lower degree of doping and a second partial spacer layer having a higher degree of doping. In this case, the first partial spacer layer is arranged nearer to the quantum film structure than the second partial spacer layer. Advantageously, a degree of doping in the growth direction of the semiconductor layer structure in the spacer layer is thereby increased between the doping level of the quantum film structure and the doping level of the p-doped layer. In this case, the increase in the degree of doping in the spacer layer can be implemented, for example, in a stepped manner or continuously.

The p-doped layer may be doped with magnesium, carbon or boron. Advantageously, these dopants have proved to be expedient. A doping of the p-doped layer with magnesium is particularly preferred.

The p-doped layer may have an indium proportion of less than 30%, preferably an indium proportion of 0%. Moreover, in this case, the p-doped layer has an aluminum proportion of less than 30%, preferably an aluminum proportion of 0%. Advantageously, a band gap in the p-doped layer can be adapted by proportions of indium and/or aluminum.

A method of producing an optoelectronic component comprises steps of providing a substrate, growing a quantum film structure, and growing a p-doped layer, wherein growing the p-doped layer comprises growing at least one first partial layer and a second partial layer, wherein the second partial layer has a higher degree of doping than the first partial layer. Advantageously, this method can be used to produce an optoelectronic component comprising a semiconductor layer structure, which optoelectronic component has an integrated ESD protection. The ESD protection is brought about by the more highly doped second partial layer of the p-doped layer, which ESD protection can bring about a distribution of a leakage current flowing through the semiconductor layer structure in an ESD loading, in a lateral direction.

As a result, it is advantageously possible to reduce a risk of a supercritically high current density in an ESD loading of the optoelectronic component and hence also a risk of damage to the semiconductor layer structure of the optoelectronic component. Advantageously, the optoelectronic component does not require an external protective diode as a result of which the optoelectronic component can be equipped with a space-saving housing. Other measures to reduce the risk of damage resulting from ESD loadings, which may be accompanied by a possible impairment of the crystal quality in the semiconductor layer structure and thus a reduction in an efficiency of the optoelectronic component, are advantageously not required either.

A plurality of first partial layers and second partial layers may be grown alternately. Advantageously, the plurality of second partial layers can then each bring about a distribution of a leakage current in a lateral direction, as a result of which a particularly effective protection against damage resulting from an ESD loading can be achieved.

A spacer layer may be grown between the quantum film structure and the p-doped layer. Advantageously, the spacer layer can prevent the quantum film structure from being disadvantageously influenced by the doping of the p-doped layer.

The above-described properties, features and advantages and the way in which they are achieved will become clearer and more clearly understood in association with the following description of the examples explained in greater detail in association with the drawings.

FIG. 1 shows a section through a semiconductor layer structure 100 of an optoelectronic component 10 in a highly schematic illustration. The optoelectronic component 10 can be a light emitting diode component, for example. The semiconductor layer structure 100 comprises layers composed of nitride compound semiconductor materials. The semiconductor layer structure 100 can comprise layers of an InGaN compound semiconductor system, for example.

Figure 2:
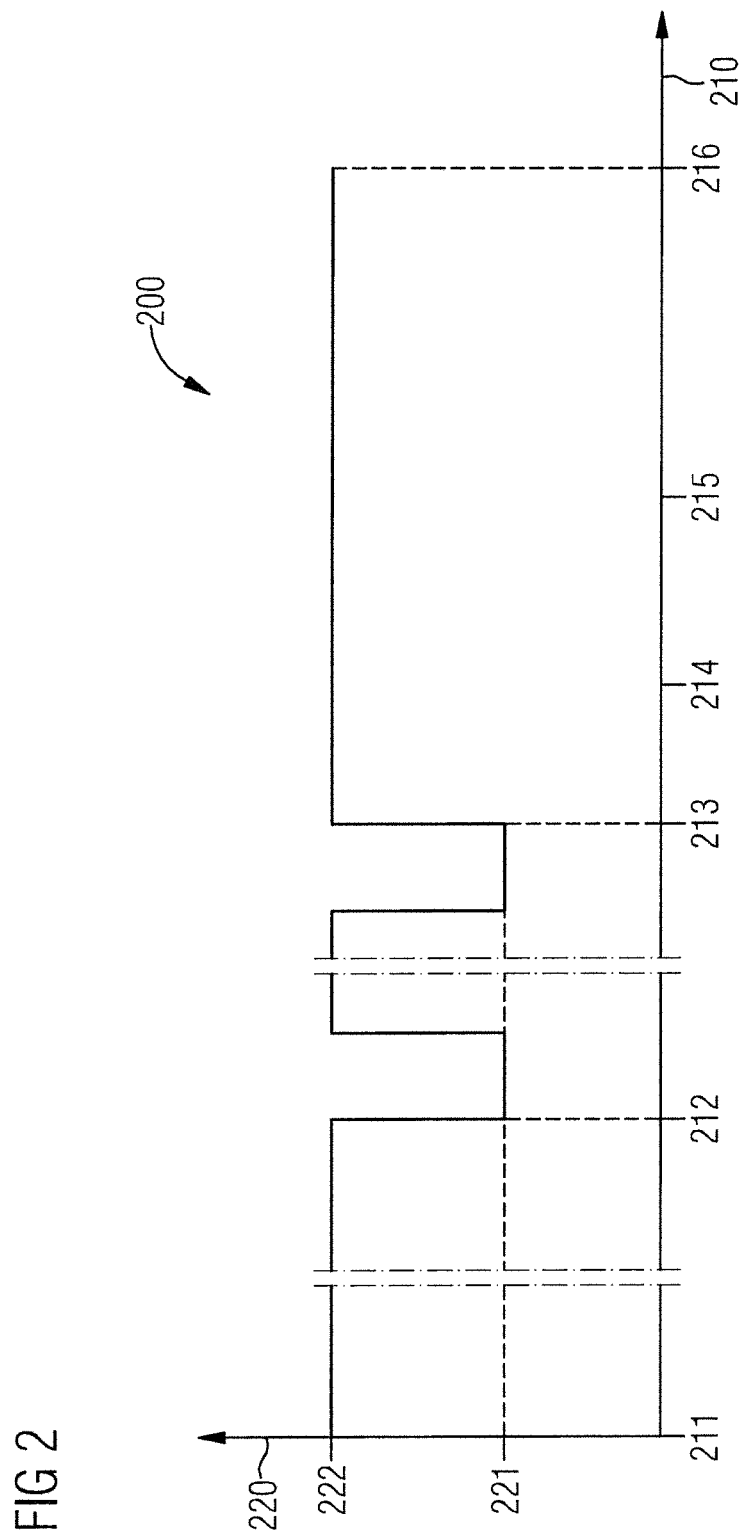
FIG. 2 shows a first growth diagram that elucidates a method of producing the semiconductor layer structure.
Figure 3:
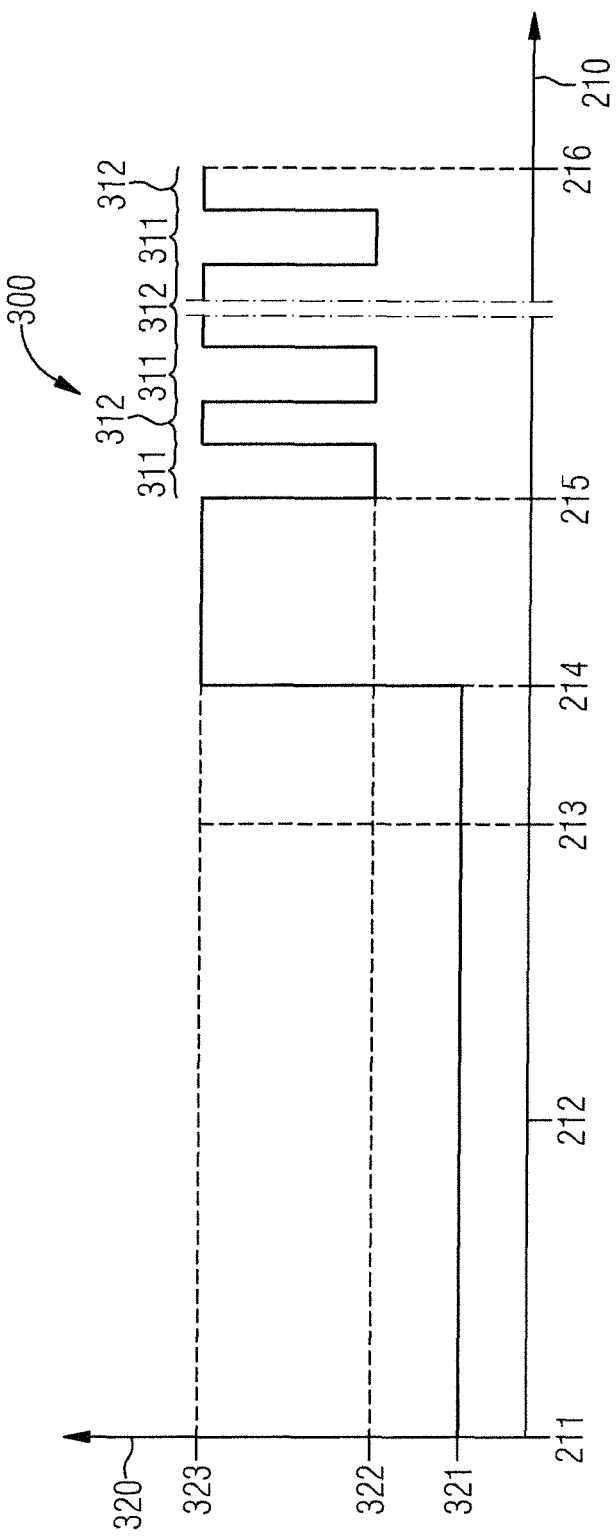
FIG. 3 shows a second growth diagram that elucidates the production method.

The semiconductor layer structure 100 of the optoelectronic component 10 is producible by epitaxial growth. FIG. 2 shows a schematic first growth diagram 200 that elucidates such a production method. FIG. 3 shows a schematic second growth diagram 300 that further elucidates the production method. A progressing time 210 is plotted on horizontal axes of both growth diagrams 200, 300. A vertical axis of the first growth diagram 200 shows a band gap energy 220 of a material grown epitaxially at a defined point in time. A vertical axis of the second growth diagram 300 shows a degree of p-doping 320 of a layer grown epitaxially at a defined point in time.

Production of the semiconductor layer structure 100 of the optoelectronic component 10 begins with the provision of a substrate 110. The substrate 110 can comprise sapphire, for example. To compensate for a lattice mismatch between a lattice constant of the material of the substrate 110 and the lattice constant of the nitride compound semiconductor system of the semiconductor layer structure 100, first a buffer layer 120 can be grown. The buffer layer 120 can comprise GaN, for example. Even further layers (not illustrated in FIG. 1) can also be grown before or after the buffer layer 120. The buffer layer 120 can also be omitted.

After epitaxial growth of the buffer layer 120 and possible further layers, epitaxial growth of an n-doped layer 130 begins at a first point in time 211. The n-doped layer 130 is grown from a material having a second band gap energy 222. The material having the second band gap energy 222 can be GaN, for example. The n-doped layer 130 is established with an n-doping. A p-doping is preferably not implemented. Consequently, the epitaxially grown n-doped layer 130 has a first degree of p-doping 321 that preferably has the value zero, as can be gathered from the second growth diagram 300 in FIG. 3. The growth of the n-doped layer 130 is carried out until a second point in time 212.

An epitaxial growth of a quantum film structure 140 begins at the second point in time 212. The epitaxial growth of the quantum film structure 140 lasts until a third point in time 213.

The quantum film structure 140 comprises a plurality of quantum films spaced apart from one another in the growth direction and arise as a result of temporally alternating growth of a material having a first band gap energy 221 and growth of a material having the second band gap energy 222. The first band gap energy 221 is less than the second band gap energy 222. The material having the first band gap energy 221 can comprise InGaN, for example. The material having the second band gap energy 222 can comprise GaN, for example. The sections of the quantum film structure 140 produced from the material having the first band gap energy 221 form quantum films, while the regions of the quantum film structure 140 produced from the material having the second band gap energy 222 form barriers arranged between the quantum films. Overall, the quantum film structure 140 can be established with, for example, three to fifteen quantum films, preferably with three to eight quantum films, particularly preferably with five quantum films.

The quantum film structure 140 is likewise established with a p-doping having the first degree of doping 321, that is to say preferably entirely without p-doping.

A spacer layer 150 of the semiconductor layer structure 100 is grown starting from the third point in time 213. The spacer layer 150 is grown from a material having the second band gap energy 222, which material comprises GaN, for example. The growth of the spacer layer 150 lasts until a fifth point in time 215.

The spacer layer 150 is established in the growth direction of the semiconductor layer structure 100 with a first layer thickness 153. The first layer thickness 153 can be 2 nm to 120 nm. Preferably, the first layer thickness 153 is 10 nm to 50 nm. Particularly preferably, the first layer thickness 153 is 20 nm to 30 nm. By way of example, the first layer thickness 153 can be 25 nm.

The spacer layer 150 spaces apart the quantum film structure 140 having the low first degree of doping 321 from a p-doped layer 160 having a higher degree of doping that subsequently follows in the semiconductor layer structure 100 to prevent the quantum film structure 140 from being disadvantageously influenced by the doping of the p-doped layer 160.

Within the spacer layer 150, the degree of p-doping 320 of the spacer layer 150 is raised from the first degree of doping 321 to a higher third degree of doping 323. The rise in the degree of p-doping within the spacer layer 150 can be implemented, for example, continuously over the entire thickness 153 of the spacer layer 150 in the growth direction of the semiconductor layer structure 100 or over a portion of the thickness 153 of the spacer layer 150 in the growth direction of the semiconductor layer structure 100. In this case, the spacer layer 150 is gradient-doped.

However, the rise in the degree of p-doping 320 of the spacer layer 150 in the growth direction of the semiconductor layer structure 100 can also be implemented in a plurality of steps or, as illustrated schematically in FIGS. 1 and 3, in one step. In this case, the spacer layer 150 is subdivided into a first partial spacer layer 151 and a second partial spacer layer 152 in the growth direction of the semiconductor layer structure 100. The first partial spacer layer 151 adjoins the quantum film structure 140. The second partial spacer layer 152 adjoins the first partial spacer layer 151 and the p-doped layer 160 succeeding the spacer layer 150. The first partial spacer layer 151 is grown between the third point in time 213 and a fourth point in time 214. Afterward, the second partial spacer layer 152 is grown between the fourth point in time 214 and the fifth point in time 215. The first partial spacer layer 151 is grown with the first degree of doping 321. The second partial spacer layer 152 is grown with the third degree of doping 323.

The epitaxial growth of the p-doped layer 160 of the semiconductor layer structure 100 begins at the fifth point in time 215. The p-doped layer 160 is formed from partial layers succeeding one another in the growth direction of the semiconductor layer structure 100. The p-doped layer 160 at least comprises one first partial layer 161 grown epitaxially during a first partial period of time 311, and one second partial layer 162 grown during a second partial period of time 312 temporally succeeding the first partial period of time 311. Preferably, however, the p-doped layer 160 comprises a plurality of first partial layers 161 and second partial layers 162 which alternately succeed one another. By way of example, the p-doped layer 160 can comprise 1 to 50 first partial layers 161 and a corresponding number of second partial layers 162. Preferably, the p-doped layer 160 comprises three first partial layers 161 and three second partial layers 162.

All first partial layers 161 of the p-doped layer 160 have a second layer thickness 163 in the growth direction of the semiconductor layer structure 100. All second partial layers 162 of the p-doped layer 160 each have a third layer thickness 164 in the growth direction of the semiconductor layer structure 100. The second layer thickness 163 and the third layer thickness 164 can be of identical magnitude, but can also differ from one another. By way of example, the second layer thickness 163 and the third layer thickness 164 can be 1 nm to 50 nm. Preferably, the second layer thickness 163 and the third layer thickness 164 are 5 nm to 20 nm. Particularly preferably, the second layer thickness 163 and the third layer thickness 164 have values of 8 to 12 nm. By way of example, the second layer thickness 163 and the third layer thickness 164 can be 10 nm.

The layer thicknesses of the first partial layers 161 and of the second partial layers 162 of the p-doped layer 160 can also vary in the growth direction of the semiconductor layer structure 100. Different first partial layers 161 then have different layer thicknesses and/or different second partial layers 162 then have different layer thicknesses.

The first partial layers 161 of the p-doped layer 160 are grown with a p-doping having a second degree of doping 322. The second degree of doping 322 is greater than or equal to the first degree of doping 321 and less than the third degree of doping 323. The second degree of doping 322 is less than $5 \times 10^{18}$ per cubic centimeter. Preferably, the second degree of doping 322 has the value zero.

The second partial layers 162 of the p-doped layer 160 are grown with a p-doping having the third degree of doping 323. The third degree of doping 323 is $1 \times 10^{18}$ per cubic centimeter to $1.5 \times 10^{20}$ per cubic centimeter. Preferably, the third degree of doping 323 is $2 \times 10^{19}$ per cubic centimeter to $8 \times 10^{19}$ per cubic centimeter. By way of example, the third degree of doping 323 can have a value of $4 \times 10^{19}$ per cubic centimeter.

It is also possible for the degrees of doping of two or more first partial layers 161 of the p-doped layer 160 and/or the degrees of doping of two or more second partial layers 162 of the p-doped layer 160 to differ from one another. By way of example, two successive second partial layers 162 of the p-doped layer 160 can have p-dopings having different degrees of doping.

The p-doped layer 160 is preferably doped with magnesium. However, it is also possible, for example, to dope the p-doped layer 160 with other dopants such as carbon or boron.

The epitaxial growth of the p-doped layer 160 of the semiconductor layer structure 100 is carried out until a sixth point in time 216. Afterward, even further layers of the semiconductor layer structure 100 can be grown, which are not illustrated in FIG. 1.

Our components and methods have been illustrated and described in more specific detail on the basis of the preferred examples. Nevertheless, this disclosure is not restricted to the examples disclosed. Rather, other variations can be derived therefrom by those skilled in the art, by departing from the scope of protection of the appended claims.

This application claims priority of DE 102013104272.4, the disclosure of which is hereby incorporated by reference.

The invention claimed is:

1. An optoelectronic component comprising:
a semiconductor layer structure having a quantum film structure;
a p-doped layer arranged above the quantum film structure; and
a spacer layer arranged between the quantum film structure and the p-doped layer,
wherein the p-doped layer comprises at least one first partial layer and a second partial layer,
the second partial layer has a higher degree of doping than the first partial layer, and
a degree of doping in a growth direction of the semiconductor layer structure in the spacer layer is increased between a doping level of the quantum film structure and a doping level of the p-doped layer.

2. The optoelectronic component according to claim 1, wherein the p-doped layer comprises a plurality of first partial layers and second partial layers which alternately succeed one another.

3. The optoelectronic component according to claim 1, wherein the first partial layer has a degree of doping less than $5 \times 10^{18}$ per cubic centimeter.

4. The optoelectronic component according to claim 1, wherein the second partial layer has a degree of doping of $1 \times 10^{18}$ per cubic centimeter to $1.5 \times 10^{20}$ per cubic centimeter.

5. The optoelectronic component according to claim 1, wherein the first partial layer and the second partial layer each have a thickness of 1 nm to 50 nm.

6. The optoelectronic component according to claim 1, wherein the p-doped layer comprises 1 to 50 first partial layers.

7. The optoelectronic component according to claim 1, wherein two second partial layers have different degrees of doping.

8. The optoelectronic component according to claim 1, wherein the spacer layer has a thickness of 2 nm to 120 nm.

9. The optoelectronic component according to claim 1,
wherein the spacer layer comprises a first partial spacer layer having a lower degree of doping and a second partial spacer layer having a higher degree of doping, and
the first partial spacer layer is arranged nearer to the quantum film structure than the second partial spacer layer.

10. The optoelectronic component according to claim 1, wherein the p-doped layer is doped with magnesium, carbon or boron.

11. The optoelectronic component according to claim 1,
wherein the p-doped layer has an indium proportion of less than 30%, and
the p-doped layer has an aluminum proportion of less than 30%.

12. A method of producing an optoelectronic component comprising:
providing a substrate;
growing a quantum film structure;
growing a p-doped layer; and
growing a space layer between the quantum film structure and the p-doped layer, wherein
growing the p-doped layer comprises growing at least one first partial layer and a second partial layer,
the second partial layer has a higher degree of doping than the first partial layer, and
a degree of doping in a growth direction of the semiconductor layer structure in the spacer layer is increased between a doping level of the quantum film structure and a doping level of the p-doped layer.

13. The method according to claim 12, wherein a plurality of first partial layers and second partial layers are grown alternately.

14. The method according to claim 12, wherein a spacer layer is grown between the quantum film structure and the p-doped layer.

15. An optoelectronic component comprising:
a semiconductor layer structure having a quantum film structure;
a p-doped layer arranged above the quantum film structure; and a spacer layer arranged between the quantum film structure and the p-doped layer, wherein the p-doped layer comprises at least one first partial layer and a second partial layer, the second partial layer has a higher degree of doping than the first partial layer, a degree of doping in a growth direction of the semiconductor layer structure in the spacer layer is increased between a doping level of the quantum film structure and a doping level of the p-doped layer, the p-doped layer comprises a plurality of first partial layers and second partial layers which alternately succeed one another, the p-doped layer has an indium proportion of less than 30%, and the p-doped layer has an aluminum proportion of less than 30%.

16. The optoelectronic component according to claim 15, wherein the p-doped layer is free of indium and free of aluminum.

* * * * *